(12) United States Patent
Nikitin

(10) Patent No.: US 7,719,793 B2
(45) Date of Patent: May 18, 2010

(54) CIRCUMFERENTIALLY PATTERNED DISK FOR LONGITUDINAL AND PERPENDICULAR RECORDING

(75) Inventor: Vladimir Nikitin, Campbell, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 561 days.

(21) Appl. No.: 11/322,120

(22) Filed: Dec. 28, 2005

(65) Prior Publication Data

US 2007/0146932 A1    Jun. 28, 2007

(51) Int. Cl.
    *G11B 5/82* (2006.01)
(52) U.S. Cl. .................................................. 360/135
(58) Field of Classification Search ............... 360/131, 360/135; 720/718
    See application file for complete search history.

(56) References Cited

U.S. PATENT DOCUMENTS

| | | | |
|---|---|---|---|
| 4,911,967 A | 3/1990 | Lazzari | 428/64 |
| 5,480,694 A | 1/1996 | Daimon et al. | 428/64.1 |
| 5,766,718 A | 6/1998 | Matsuda et al. | 428/65.3 |
| 6,583,957 B1* | 6/2003 | Takeshita et al. | 360/135 |
| 6,613,459 B1 | 9/2003 | Saito et al. | 428/692 |
| 6,620,480 B1 | 9/2003 | Ledieu | 428/64.4 |
| 6,703,099 B2 | 3/2004 | Belser | 428/64.2 |
| 6,773,782 B2 | 8/2004 | Takeshita et al. | 428/64.2 |
| 7,095,581 B2* | 8/2006 | Tagami | 360/77.08 |
| 7,351,445 B2* | 4/2008 | Haginoya et al. | 427/131 |
| 7,352,529 B2* | 4/2008 | Hibi et al. | 360/135 |
| 7,385,785 B2* | 6/2008 | Hattori et al. | 360/135 |
| 7,409,759 B2* | 8/2008 | Sewell | 29/603.01 |
| 7,422,808 B2* | 9/2008 | Sugimoto et al. | 428/828.1 |
| 7,615,292 B2* | 11/2009 | Ito et al. | 428/831.2 |
| 2004/0161576 A1 | 8/2004 | Yoshimura | 428/65.3 |
| 2004/0166372 A1 | 8/2004 | Haginoya et al. | 428/694 |
| 2008/0007869 A1* | 1/2008 | Sato et al. | 360/131 |

FOREIGN PATENT DOCUMENTS

| | | | |
|---|---|---|---|
| DE | 3515543 A | * | 11/1986 |
| EP | 0 422 640 A2 | | 4/1991 |
| JP | 04176021 A | * | 6/1992 |

OTHER PUBLICATIONS

Chinese Office Action Summary from application No. 2006/10171268.7 Issued on Sep. 19, 2008.

* cited by examiner

*Primary Examiner*—Julie Anne Watko
(74) *Attorney, Agent, or Firm*—Zilka-Kotab, PC

(57) ABSTRACT

A magnetic medium for use in data recording that has a series of concentric magnetic track portions separated from one another by non-magnetic portions or gap portions. The magnetic portions define data tracks and prevent signals from one track from bleeding into another track. Because the data tracks are distinctly separated, adjacent track interference is completely avoided. The disk may be manufactured by depositing first and second materials sequentially onto a rotating tube, the first and second materials having different etch rates. The tube may then be slid into disks and the disks subjected to a reactive ion etch (RIE) to form a disk surface having concentric raised portions separated by concentric recessed portions. A magnetic material can then be deposited. An optional chemical mechanical polishing process can then be performed to planarize the surface, resulting in a planar surface having rings of magnetic material separated by rings of non-magnetic material.

2 Claims, 11 Drawing Sheets

CIRCUMFERENTIALLY PATTERNED DISK FOR LONGITUDINAL AND PERPENDICULAR RECORDING

FIELD OF THE INVENTION

The present invention relates to magnetic data recording, and more particularly to a magnetic disk for use in a disk drive system, wherein the disk is configured with data tracks in the form of concentric rings of magnetic material separated by non-magnetic material or gaps.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk and when the disk rotates, air adjacent to the surface of the disk moves along with the disk. The slider flies on this moving air at a very low elevation (fly height) over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

A common write head configuration includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The push for ever increased data rate and data capacity has lead a push for ever decreased track width and increased track density on a magnetic disk. As the data tracks on the disk become smaller and closer together adjacent track interference becomes more and more of a problem. Adjacent track interference occurs when a signal from an adjacent track interferes with the reading of an intended track signal. Adjacent track writing is also a problem. A signal from a write element can affect a track adjacent to the track on which the signal is intended to be written.

Therefore, there is a strong felt need for a means for avoiding adjacent track interference and adjacent track writing in a disk drive system. Such a mechanism for avoiding adjacent track interference and adjacent track writing would preferably be cost effective and easily manufactured.

SUMMARY OF THE INVENTION

The present invention provides a magnetic medium for use in a data recording system. The magnetic medium has concentric magnetic track portions separated by gaps or non-magnetic portions. The magnetic medium is in the form of a disk and has track portions are formed as concentric rings on the surface of the disk.

The magnetic disk may have raised portions configured as concentric rings and recessed portions configured as concentric rings. The surface can be covered with a magnetic material, so that the raised portions define the track and the recessed portions define a gap between the tracks.

The magnetic disk may also be configures as a planar surface that includes a plurality of magnetic rings separated by concentric rings of non-magnetic material. The magnetic rings and the non-magnetic rings may have surfaces that are coplanar.

A magnetic disk according to the present invention, allows the track location and width to be defined by the disk itself and completely eliminates any adjacent track interference. Accordingly, a very clear data signal can be recorded and read without any cross track interference, even at extremely small track widths and high track pitches.

These and other advantages and features of the present invention will be apparent upon reading the following detailed description in conjunction with the Figures.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
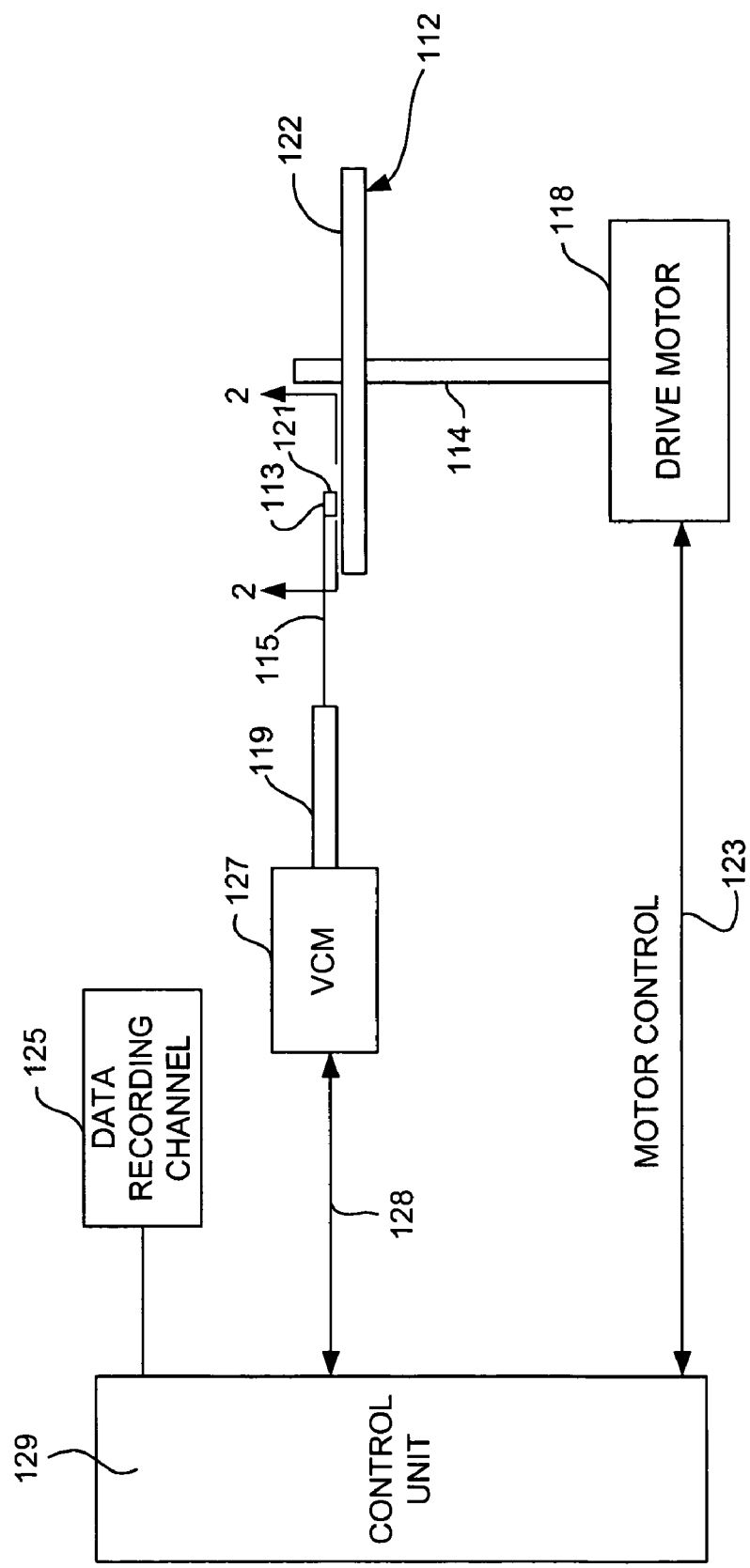
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
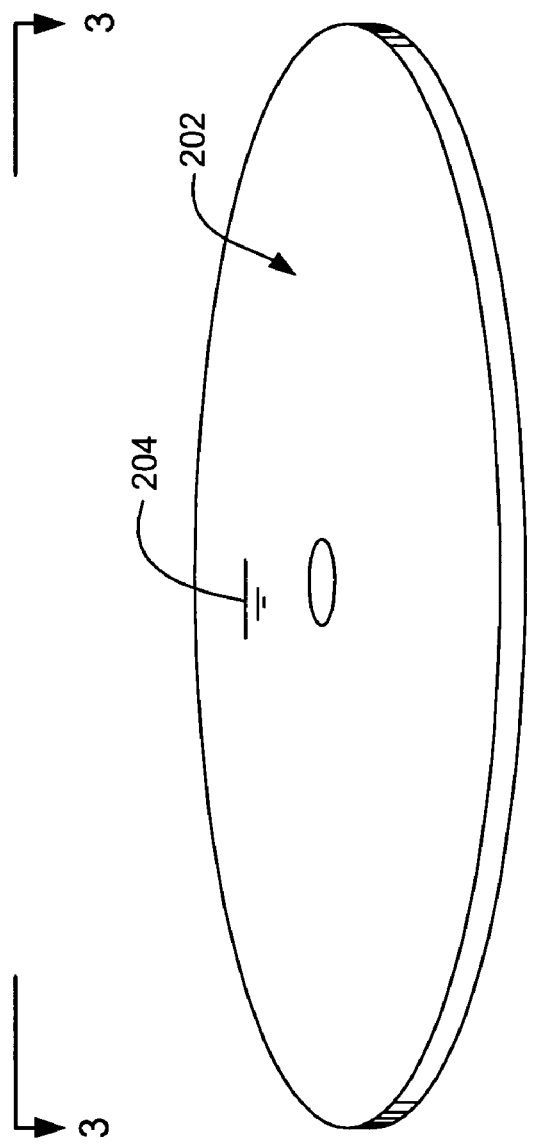
FIG. 2 is a view of a disk according to an embodiment of the invention.
Figure 3:
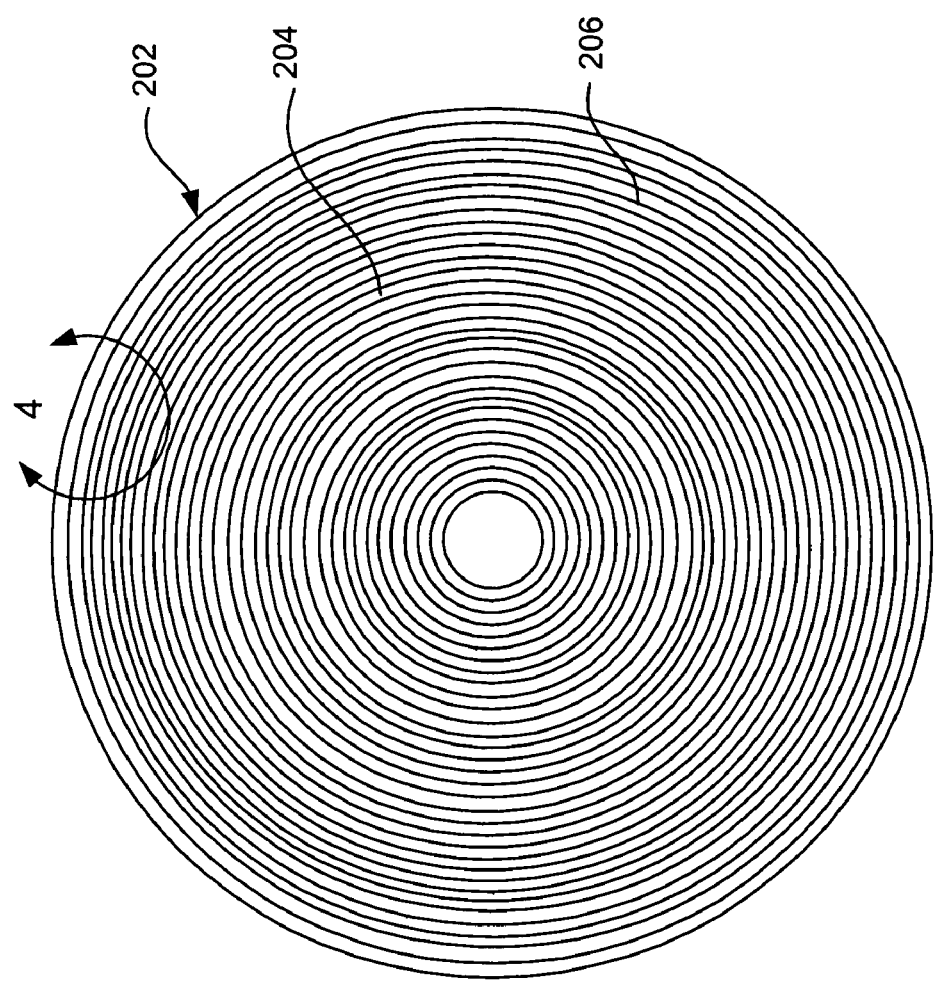
FIG. 3 is a view taken from line 3-3 of FIG. 2.
Figure 4:
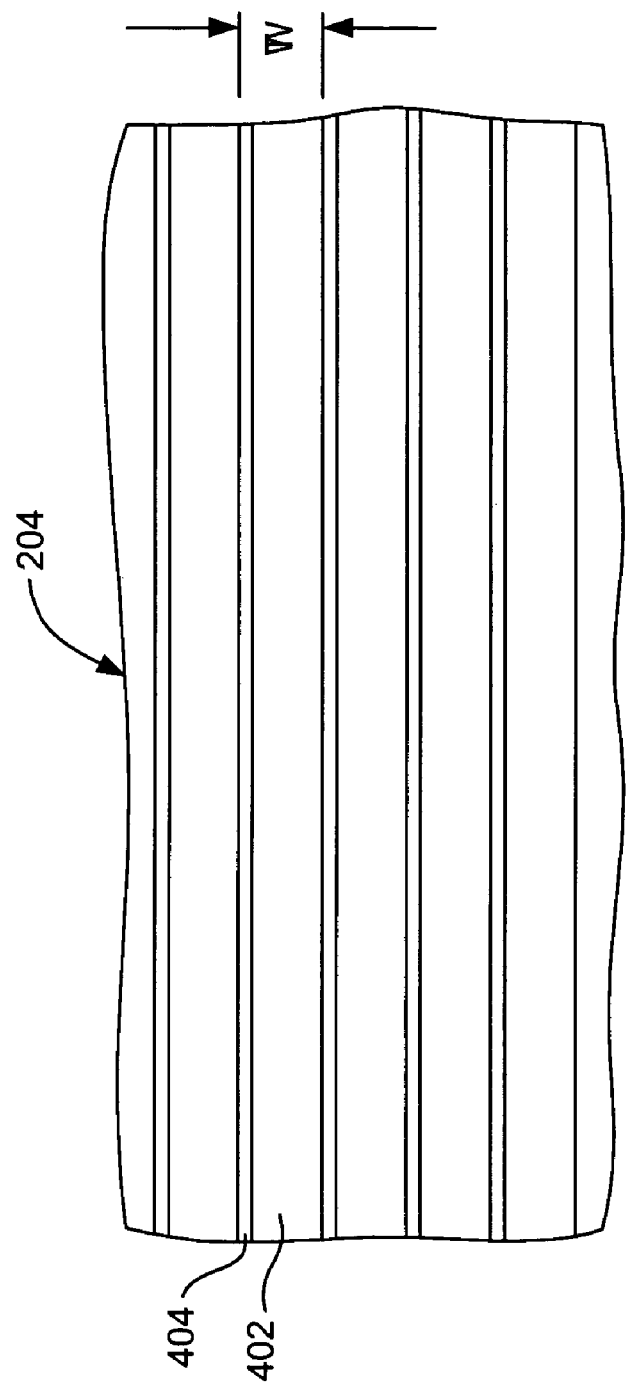
FIG. 4 is an enlarged view taken from circle 4 of FIG. 3.

With reference to FIG. 2, a magnetic disk 202 for use in a magnetic disk drive device has a novel magnetic surface 204 that avoids adjacent track interference and adjacent track writing. With reference to FIG. 3, the surface 204 can be seen to have concentric rings 206 of magnetic material, each of which can define a data track of data. This can be seen more clearly with reference to FIG. 4, which shows a portion of the surface 204 of the disk 202 enlarged and in greater detail. As can be seen in FIG. 4, the disk has magnetic track portions 402 separated by thinner non-magnetic gaps 404. The track portions 402, therefore, have a width that defines a track width (TW). The width of the magnetic portion may define a track width of a disk drive system. The magnetic portions 402 may include a material such as NiFe, CoFe, etc. The non-magnetic portion 404 may include a material such as alumina ($Al_2O_3$) $Si_3N_4$, $Si(ON)_x$, etc. or may simply be an air gap, where the magnetic material in the portion 404 is recessed relative to the track portion 402.

Figure 5:
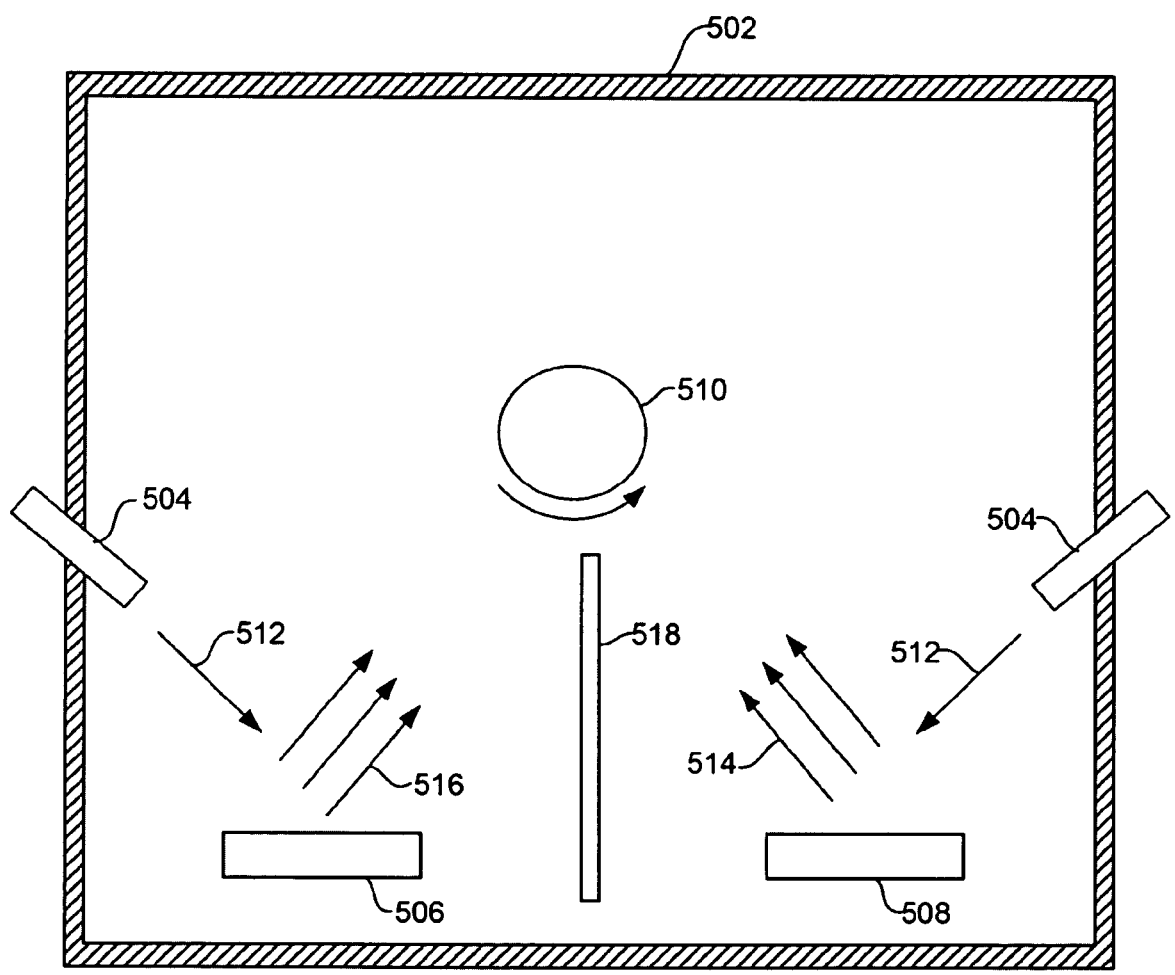
FIG. 5 is a view of a schematic view of a deposition system according to an embodiment of the invention.

With reference to FIGS. 5-11, several possible methods for constructing such a disk media are described. With particular reference to FIG. 5, a method includes the use of a sputter deposition chamber 502. The chamber 502 includes at least one, and preferably two ion beam guns 504, and first and second targets 506, 508. A rod 510 is held within the chamber in such a manner that it can rotate about its axis.

The first and second targets 506, 508 are constructed of materials having different material removal rates when exposed to, for example, a reactive ion etch (RIE). For example, the first target 506 can be constructed of alumina ($Al_2O_3$) while the second target 508 can be constructed of a material such as $Si_3N_4$, $SiO_2$, $Si(ON)_x$, Ta, etc.

Material deposition is performed while the rod 510 is rotating. This is accomplished by activating the ion beam guns 504, while the rod 510 is rotated. Ion beams 512 from the ion beam guns 504 cause atoms, and or ions 514, 516 to be dislodged from the targets 506, 508. These atoms or ions 514, 516 are then deposited onto the rotating rod 510. A divider 518 may be provided between the targets so that material from only one target 506, 508 at a time is deposited onto a given portion of the rod 510.

Figure 6:
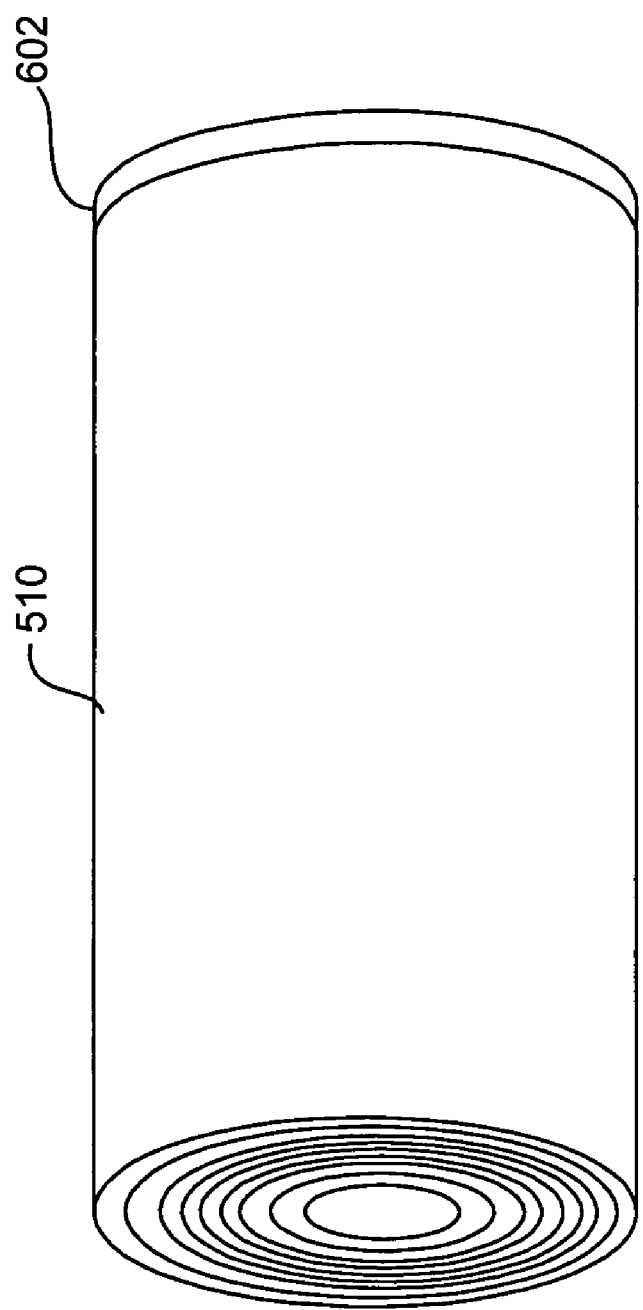
FIG. 6 is a view of a cylinder having alternating concentric layers of material.

As can be seen, the material deposition scheme described with reference to FIG. 5 allows two different materials to be deposited sequentially, one on top of the other. This results in a rod having a series of concentric layers of alternating materials. With reference now to FIG. 6, after deposition, this rod 510 can be sliced into disks 602.

Figure 7:
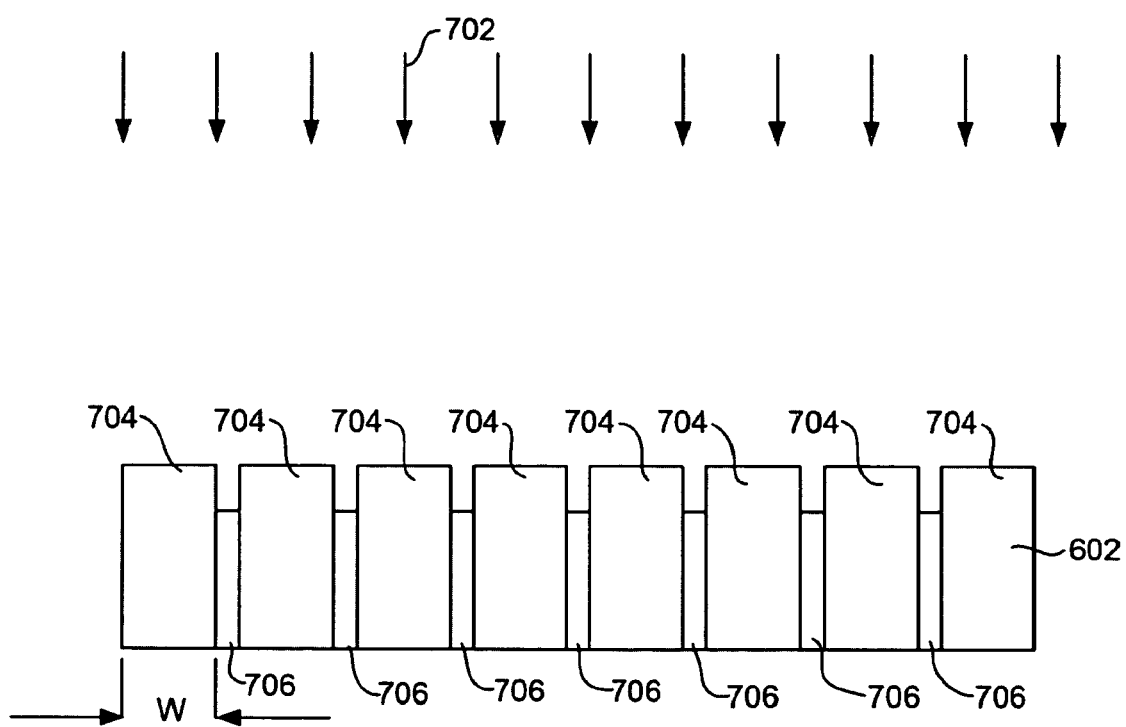
FIG. 7 is an enlarged cross sectional view of a disk sliced from the cylinder of FIG. 6.

FIG. 7 shows a cross section of only a small portion of the disk 602. The disk can be polished using a conventional polishing technique such as chemical mechanical polishing (CMP). As shown in FIG. 7, the disk 602 undergoes a material removal process such as a reactive ion etch (RIE) 702. As mentioned above, the materials 704, 706 deposited from targets 506, 508 as described in FIG. 5, have different etch rates. For example, the first material 704 could be constructed of alumina, and would etch much slower than the second material which might be constructed of $Si_3N_4$, $SiO_2$, $Si(ON)_x$, Ta, etc. This results in significant recession of the second material 706. The reactive ion etch (RIE) 702 can be performed, for example, using a fluorine chemistry such as $CHF_3$, $CF_4$, $CF_6$, etc. Using such a RIE 702, the materials 704, 706 will have very different etch rates. For example, the etch rates of $Si_3N_4$ and alumina have a ratio of 10:1.

Figure 8:
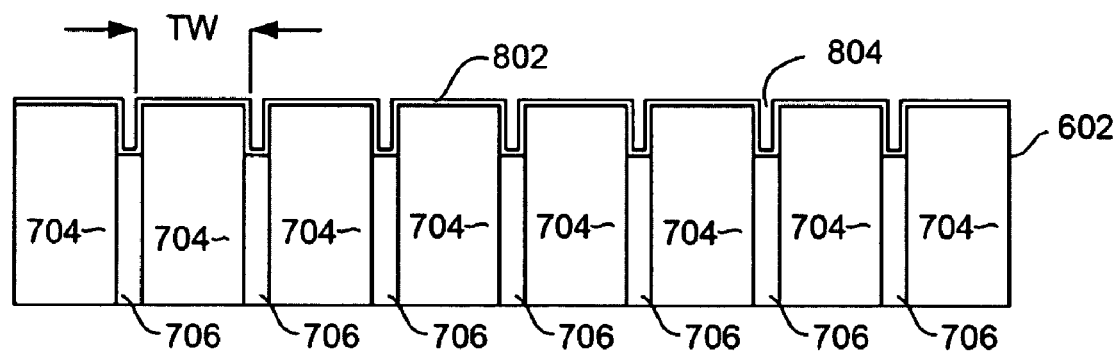
FIG. 8 is a cross sectional view similar to that of FIG. 7 with a layer of magnetic material deposited.

In the disk 602 described in FIG. 7, the slower etching material 704 has a width W that controls the track width of the disk. With reference to FIG. 8, a thin layer of magnetic material 802 is deposited. The magnetic material can be a material such as NiFe, CoFePt, CoFeB or any other material used for disk manufacturing and is preferably deposited by a conformal deposition method such as chemical vapor deposition, atomic layer deposition, etc. The width (TW) of the magnetic material across the top of the slower etching material 704 defines the track width. As can be seen, the magnetic material extends down in to a recess between adjacent layers of the first material 704, providing a gap 804 in the magnetic surface of the disk 602.

Figure 9:
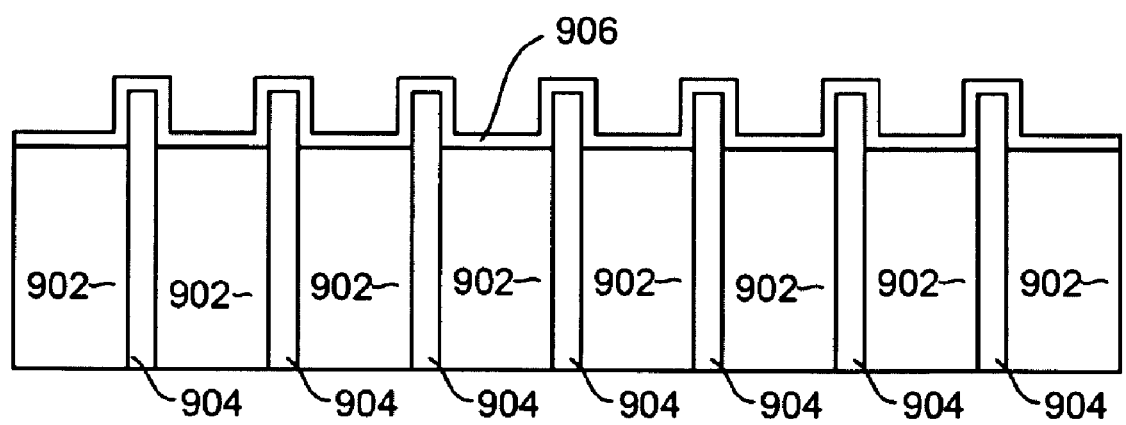
FIG. 9 is an enlarged cross sectional view of a disk according to an alternate embodiment of the invention.

With reference now to FIG. 9, in an alternate embodiment of the invention, a faster etching material can be used for the first set of material layers (track width defining layers) 902, while a slower etching material can be used for the second set of material layers (gap defining layers) 904. A reactive ion etch (RIE) results in recession of the first layers 902. The REI can have a chemistry such as that described above with reference to FIG. 7. A magnetic material 906 such as NiFe or CoFe is then deposited, preferably by a conformal deposition method such as chemical vapor deposition, atomic layer deposition, etc.

Figure 10:
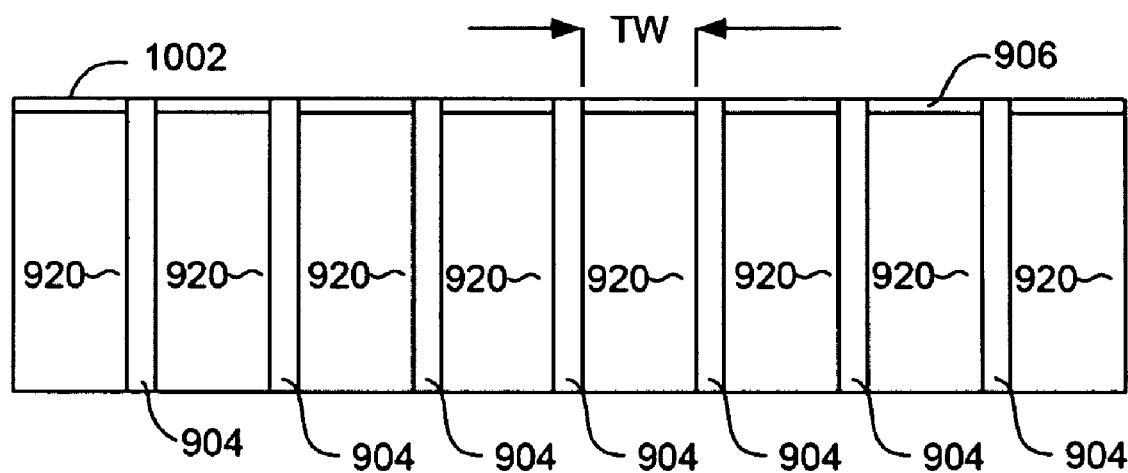
FIG. 10 is a cross sectional view of the disk of FIG. 9 after a polishing process.

With reference now to FIG. 10, a chemical mechanical polishing process can be performed to planarize the surface 1002 of the disk 602. This chemical mechanical polishing process results in a surface 1002 having magnetic layers only over the areas of the first (track width defining) material 902, and not over the areas of the second (gap defining), material 904. Therefore, as can be seen, the width of the layers of track width defining material 902 defines the trackwidth (TW) of the disk 602.

Figure 11:
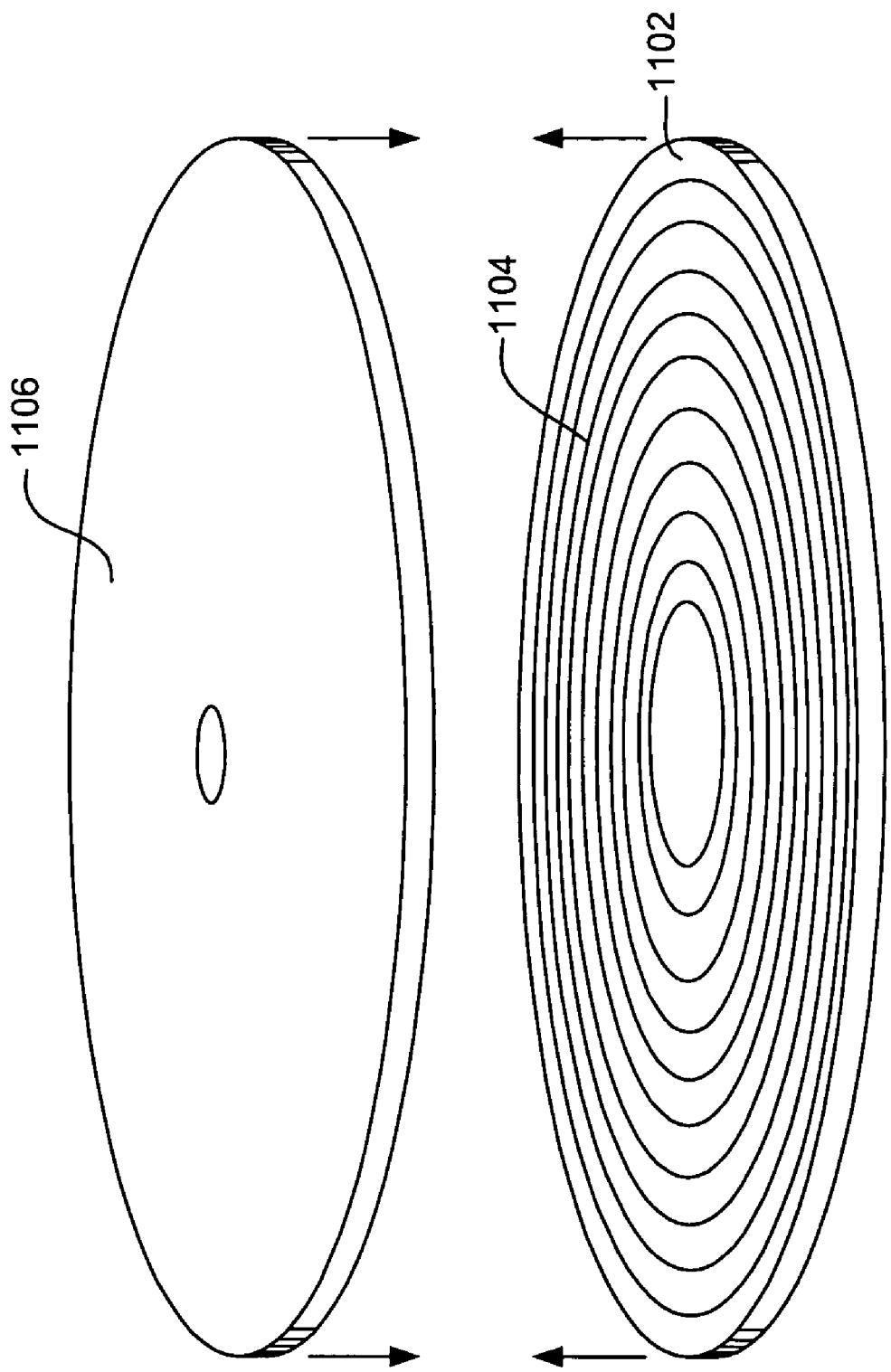
FIG. 11 is schematic view illustrating an alternate method of manufacturing a disk according to an embodiment of the invention.

With reference now to FIG. 11, another method of constructing a disk is illustrated, and uses a technique that has been referred to as nano-imprint technology. This embodiment could be useful when greater throughput is desired, such that the above described methods become too costly. In this embodiment, a disk 1102 is created, such as by the deposition, and etching methods described with reference to FIGS. 5, 6 and 7 (or 5, 6 and 8) except that a magnetic material is not deposited over the disk 1102. This forms the disk (die) 1102 with a surface having raised concentric rings 1104. A second disk (workpiece) 1106 is then provided, which may have a thin magnetic layer formed on its surface. The first textured disk 1102, can then be used, as a die to imprint a desired surface shape onto the second disk 1106. The two disks are arranged so that they face one another, and then are pressed together with great pressure to imprint a series of concentric rings onto the surface of the disk 1106. If the workpiece disk 1106 is configured with a thin magnetic surface layer prior to pressing the disks 1102, 1106 together, then that magnetic surface will be oriented toward the first disk (die) 1102 during the pressing of the disks 1102, 1106. Alternatively, the workpiece disk 1106 can be provided without a magnetic coating. The disks 1102, 1106 can then be pressed together to form the desired texture on the second disk (workpiece disk) 1106, and a magnetic material can be deposited onto the textured surface after the disks 1102, 1106 have been pressed together and the desired texture formed on the second disk 1106.

A polishing process such as chemical mechanical polishing (CMP) can then be performed to remove magnetic material only from the raised portions of the disk leaving the recessed portions with a magnetic layer. This would be similar to the process described with reference to FIGS. 9 and 10. Alternatively, polishing step can be eliminated. In that case, the recessed portions would provide the gap between the magnetic track portions similar to the disk described with reference to FIG. 8.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetic medium for use in a data recording system, the magnetic medium comprising:
    a disk having surface and comprising a plurality of concentric rings of a first non-magnetic material separated from one another by concentric rings of a second non-magnetic material wherein the concentric rings of the second magnetic material are recessed at the surface of the disk; and
    a layer of magnetic material covering both the first and second materials, the surface of the disk having raised portions at the location of the first material and recessed portions at the location of the second material.

2. A magnetic media as in claim 1 wherein the first material comprises alumina and the second material comprises a material selected from the group consisting of $Si_3N_4$, $SiO_2$, $Si(ON)_x$ and Ta.

* * * * *